United States Patent [19]

Minami

[11] 4,094,007
[45] June 6, 1978

[54] TEMPERATURE-COMPENSATED ANALOG VOLTAGE MEMORY DEVICE

[75] Inventor: Shunji Minami, Katano, Japan

[73] Assignee: Matsushita Electric Industrial Co., Ltd., Japan

[21] Appl. No.: 745,226

[22] Filed: Nov. 26, 1976

[30] Foreign Application Priority Data

Dec. 4, 1975 Japan .................................. 50-144871
Dec. 12, 1975 Japan .................................. 50-148698
Dec. 26, 1975 Japan .................................. 50-159391

[51] Int. Cl.² .............................................. G11C 11/40
[52] U.S. Cl. ...................................... 365/45; 365/149; 365/177; 365/211; 357/43
[58] Field of Search ....................... 340/173 R; 357/43

*Primary Examiner*—Terrell W. Fears
*Attorney, Agent, or Firm*—Burgess, Ryan and Wayne

[57] ABSTRACT

In an analog voltage memory device of the type wherein a gate of a MOS field-effect transistor is connected to one terminal of analog switching means and to one terminal of a nonpolarized capacitor with the other terminal grounded, whereby a DC analog input voltage may be held as a source follower voltage of MOS field-effect transistor, adverse effects on the operation due to the variation in ambient temperature are eliminated by a constant current circuit including a NPN transistor. Variation in output due to the variation in ambient temperature may be minimized independently of drain current of MOS field-effect transistor, and drifts due to variation in ambient temperature of equipment and instruments such as pollution detectors and recorders which are installed outdoors may be reduced to a minimum. This analog voltage memory device is used as peak hold memory, sample-and-hold memory, zero-point memory, etc. and can well hold signals for a long time to achieve a non-volatile memory in spite of no power supply.

8 Claims, 6 Drawing Figures

TEMPERATURE-COMPENSATED ANALOG VOLTAGE MEMORY DEVICE

BACKGROUND OF THE INVENTION

The present invention relates to a temperature compensated analog voltage memory device.

The same inventor disclosed an analog voltage memory device comprising a field-effect transistor (to be referred to as "MOSFET" in this specification) having its drain connected to a power supply, its gate connected to one terminal of a nonpolarized capacitor with the other terminal grounded and its source connected to one end of an output resistor with the other end grounded. Drain current changes in response to a voltage across the nonpolarized capacitor which is charged or discharged, and is kept at a constant level when the charging or discharge of the capacitor is interrupted so that an output voltage in proportion to a voltage across the capacitor may be derived across the output resistor connected to the source of MOSFET.

However, the inventor observed that even when a voltage applied to the gate of MOSFET is kept constant, an output voltage varies over a wide range because drain current changes significantly due to the variation in ambient temperature and that, as a result, the temperature-output characteristics are considerably deviated at high and low temperature extremes.

SUMMARY OF THE INVENTION

One of the objects of the present invention is therefore to provide a temperature-compensated analog voltage memory device which may assure stable operation of holding a DC analog voltage regardless of the change in ambient temperature. Another object of the present invention is to provide a temperature-compensated analog voltage memory device wherein a constant current circuit is inserted in order to eliminate adverse effects caused by the change in ambient temperature.

Briefly stated, to the above and other ends, the present invention provides a temperature compensated analog voltage memory device comprising a MOSFET, analog switching means having its one end connected to the gate of said MOSFET, a nonpolarized capacitor interconnected between said gate of said MOSFET and ground, an NPN transistor having its collector connected to a source of said MOSFET and its emitter connected through a resistor to a negative power supply, and a constant voltage means connected to a base of said NPN transistor, whereby, an input applied to the other terminal of said analog switching means being memorized and transferred output, a non-volatile memory being made.

DESCRIPTION OF THE PREFERRED EMBODIMENTS

Figure 1:
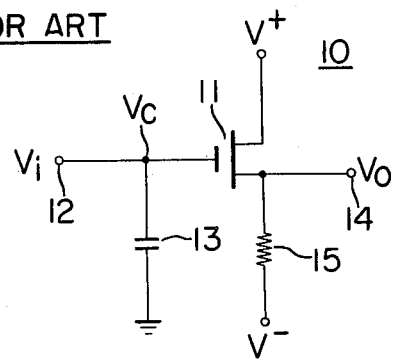
FIG. 1 is a diagram of a fundamental analog voltage memory device employing a MOSFET devised by the same inventor.

Prior to the description of the preferred embodiments of the present invention, an analog voltage memory which the same inventor devised will be described briefly with reference to FIG. 1. An analog voltage memory generally indicated by 10 comprises a MOSFET 11 having its gate connected to an input terminal 12 and to one terminal of a nonpolarized capacitor with the ther terminal grounded, its drain connected to a positive source V$^+$ and its source connected to an output terminal 14 and an output resistor 15 which in turn is connected to a negative source V$^-$.

When an input voltage V$i$ is applied to the input terminal 12, a voltage V$c$ across the capacitor 13 rises so that drain current increases and consequently an output voltage V$o$ across the output resistor 14 also increases. When the input voltage V$i$ is removed, the capacitor 13 is not charged so that the output voltage V$o$ remains at the same level.

Figure 2:
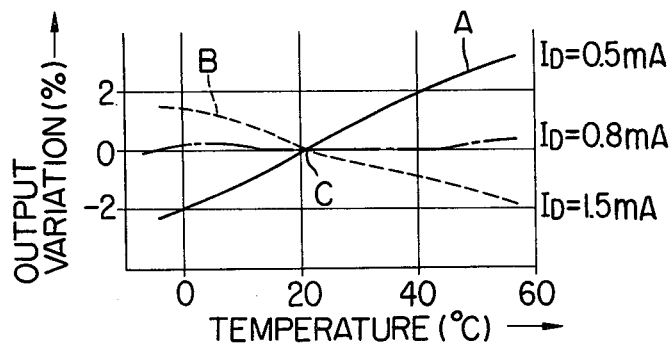
FIG. 2 shows temperature-output characteristic curves of the device shown in FIG. 1.

However, depending upon an ambient temperature drain current I$_D$ and hence output voltage V$o$ change abruptly over a wide range even when a gate voltage or voltage across the capacitor 13 is maintained constant as shown in FIG. 2, where curves A and B indicate drain currents of 0.5 and 1.5 mA, respectively. It is clear from FIG. 2 that an output changes considerably at high and low temperatures. The present invention was made to overcome this problem.

Figure 3:
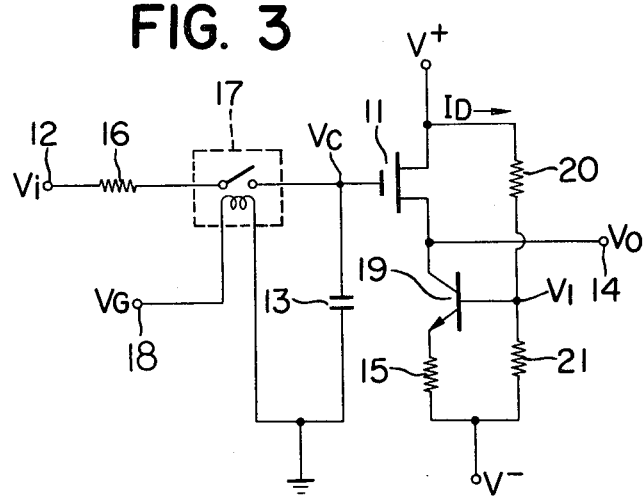
FIG. 3, 4, 5 and 6 are circuit diagrams of a first, a second, a third and a fourth embodiment, respectively, of the present invention.

First Embodiment, FIG. 3

In the first embodiment shown in FIG. 3, the input terminal 12 is connected to the gate of MOSFET 11 through a resistor 16 and contacts of a reed relay 17 with a coil having its one end grounded and the other end connected to a gate terminal 18 to which is impressed a gate signal V$_G$. The source of MOSFET 11 is connected to a collector of an NPN transistor 19 having its emitter connected through the output resistor 15 to the negative source V$^-$. A base of the transistor 19 is connected to the junction of resistors 20 and 21 which are connected in series between the positive and negative sources V$^+$ and V$^-$ to provide a voltage divider.

Next the mode of operation of the first embodiment with the above construction will be described. An input voltage V$i$ is applied to the input terminal 12 and gate signal V$_G$, which is V$^+$, is applied to the gate terminal 18 so that the coil of the reed relay 17 is energized to close the contacts. As a result, a voltage V$c$ across the capacitor 13 rises at a rate which is dependent upon a time constant determined by values of the resistor 16 and the capacitor 13. When the gate signal V$_G$ is removed, the reed relay 17 is turned off to interrupt the charging of the capacitor 13 so that an output voltage V$o$ which appears at the output terminal 14 remains at the same level.

Meanwhile drain current I$_D$ of MOSFET 11, which is heavily dependent upon an ambient temperature, remains unchanged at a point C in FIG. 2. Therefore it is assumed that when drain current I$_D$ is 0.8 mA MOSFET is temperature stabilized. Then, from the circuit shown in FIG. 3, we have $$I_D = [(V_1 - V^-) - 0.6]/R_2$$

where 0.6 = base-emitter voltage of transistor 19, $V_1$ = base voltage, and
$R_2$ = resistance of resistor 15.

Therefore in the first embodiment it is possible to make $I_D$ = 0.8 mA by the suitable selection of values $R_2$, $R_3$ and $R_4$ of the resistors 15, 20 and 21. This drain current $I_D$ remains unchanged independently of an output voltage Vo which is higher than $V_1$.

Next an input voltage $-Vi$ is applied to the input terminal 12 and a gate signal $V_G$, which is also $V^+$, is applied to the gate terminal 18 so that the coil of the reed relay 17 is energized to close the contacts. As a result, charge on the capacitor 13 is decreased and so is a source follower voltage of MOSFET 11. When the gate signal $V_G$ is removed, the relay 17 is turned off to interrupt the discharge of the capacitor so that an output voltage Vo is maintained at a constant level which is dependent upon the voltage across the capacitor 13 when the relay 17 is turned off.

Thus an output voltage Vo which appears at the output terminal 14 may be held arbitrarily within the following range $$V_1 < Vo < V^+.$$

Because of a constant current source circuit consisting of the transistor 19, the first embodiment may attain such excellent stability as 300 uV/° C independently of the variation of a holding voltage across the capacitor 13 as shown in FIG. 3.

Figure 4:
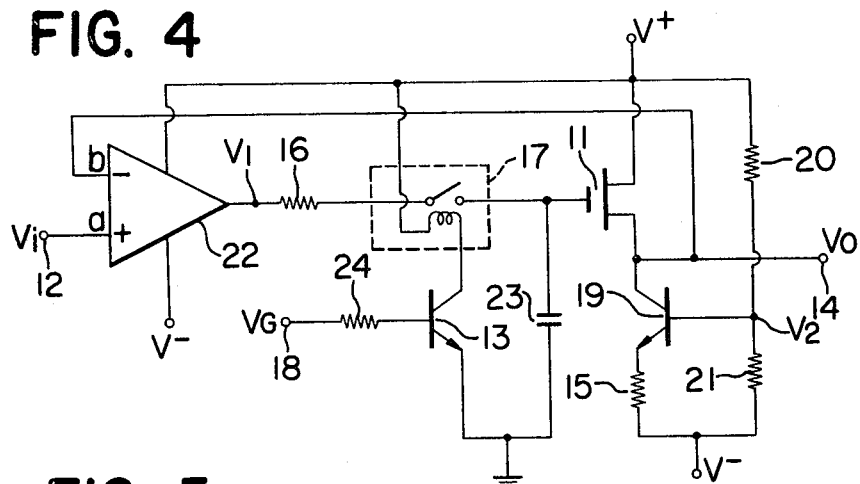

Second Embodiment, FIG. 4

In the second embodiment shown in FIG. 4, a movable contact of the reed relay 17 is connected through the input resistor 16 to an output terminal of an operational amplifier 22 with an inverting input terminal b connected to the source of MOSFET 11 and a noninverting input terminal a connected to the input terminal 12 to which is applied an input voltage Vi. The other end of the coil of the relay 17 is connected to a collector of a switching transistor 23 with an emitter grounded and a base connected through a resistor 24 to the gate terminal 18 to which is applied a gate signal $V_G$. The positive and negative sources $V^+$ and $V^-$ are connected to the operational amplifier 22.

Next the mode of operation of the second embodiment with the above construction will be described. When an input voltage Vi is higher than an output voltage Vo; that is, when $Vi < Vo$, an output $V_A$ from the operational amplifier 22 is substantially equal to $V^+$, but when $Vi < Vo$, an output $V_A$ is substantially equal to $V^-$. When a gate signal $V_G$, which is impressed at the gate terminal 18, is applied to the base of the switching transistor 23, it is enabled to conduct so that the coil of the relay 17 is energized to close the contacts and consequently the capacitor 13 is charged or discharged depending upon the polarity of an input voltage. As a result, a source follower output from MOSFET 11 increases or decreases and when $Vo = Vi$ the charging or discharging of the capacitor 13 is interrupted. When the gate signal $V_G$ is removed, the switching transistor 23 is disabled so that the coil of the reed relay 17 is de-energized to open the contacts. Therefore an output voltage Vo is maintained at a constant level.

In the second embodiment, briefly stated, upon application of an input voltage Vi and a gate signal $V_G$, the input voltage Vi is converted into an output voltage Vo, which is held at a constant level. As with the case of the first embodiment, the values $R_2$, $R_3$ and $R_4$ of the resistors 15, 20 and 21 are suitably selected so that an optimum drain current $I_D$ may be drawn from MOSFET 11 so as to stabilize the operation against the variation in ambient temperature. Thus, a substantially flat temperature-output characteristic curve may be obtained.

Figure 5:
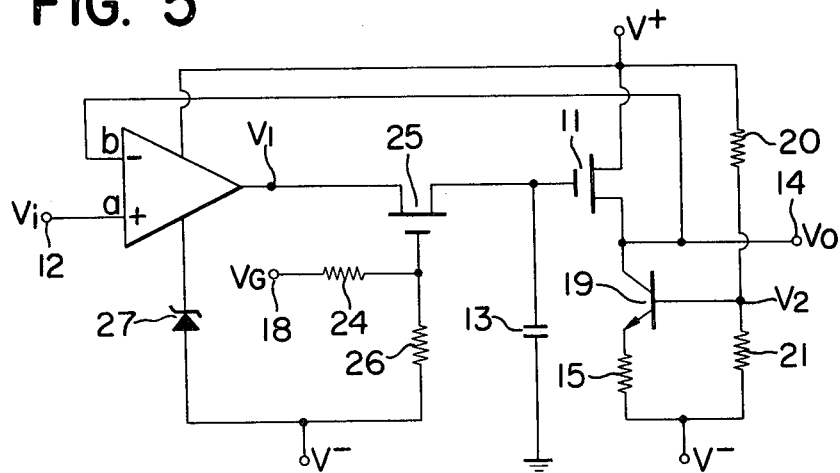

Third Embodiment, FIG. 5

The third embodiment shown in FIG. 5 is substantially similar in construction to the second embodiment described above with reference to FIG. 4 except that the input resistor 16, the reed relay 17 and the switching transistor 23 are eliminated and instead a MOSFET 25 and a zener diode 27 are added. More specificaly, the output terminal of the operational amplifier 22 is connected to the gate of MOSFET 11 through a drain and a source of the MOSFET 25 which functions as an analog switching means. The gate terminal 18 is connected through the resistor 24 to the gate of MOSFET 25 and the negative source $V^-$ is connected through a resistor 26 to the gate of MOSFET 25 and through the zener diode 27 to the operational amplifier 22.

In the third embodiment, the charging and discharge of the capacitor 13 is effected through an internal resistor of MOSFET 25 so that the input resistor 16 which is employed in the first and second embodiments may be eliminated. The mode of operation of the third embodiment is substantially similar to that of the second embodiment shown in FIG. 4.

Figure 6:
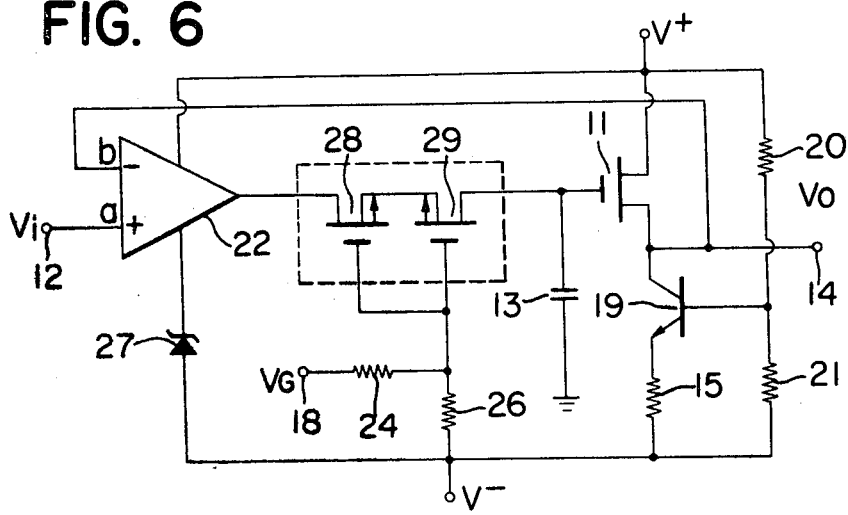

Fourth Embodiment, FIG. 6

The fourth embodiment shown in FIG. 6 is a modification of the third embodiment shown in FIG. 5. Instead of the MOSFET 25, two MOSFETs 28 and 29 are used which have their bulks physically connected and sources electrically connected to each other. The MOSFET 25 shown in FIG. 5 is equivalent to a reverse-bised diode when MOSFET 25 is disabled so that the capacitor 13 may keep charge. The MOSFETs 28 and 29 function as a switch having extremely high resistance, just as the reed relay 17.

As described above, the present invention provides temperature-ompensated analog voltage memory devices which may hold an input voltage in an nonvolatile manner and in which temperature drifts are minimzed. Therefore they may find a variety of wide applications in many fields such as analog instruments. Because drifts due to the variation in ambient temperature may be minimized, excellent performance may be assured especially when they are incorporated into outdoor equipment and instrument such as pollution detectors and recorders.

What is claimed is:

1. A temperature-compensated analog voltage memory device comprising
   (a) a MOS field-effect transistor,
   (b) analog switching means having one terminal connected to the gate of said MOS field-effect transistor,
   (c) a nonpolarized capacitor interconnected between the gate of said MOS field-effect transistor and ground, leakage of said capacitor being prevented by said MOS field-effect transistor and said capacitor,
   (d) an NPN transistor having its collector connected to the source of said MOS field-effect transistor, said NPN transistor being used as a constant current source and to make constant drain current of said MOS field-effect transistor, (e) an output resistor interconnected between the emitter of said NPN transistor and a negative power supply, and (f) a constant voltage means connected to the base of said NPN transistor, whereby, an input applied to the other terminal of said analog switching means being memorized and transferred output, a non-volatile memory being made.

2. A temperature-compensated analog voltage memory device as set forth in claim 1 wherein
said analog switching means consists of a reed relay.

3. A temperature-compensated analog voltage memory device as set forth in claim 1 wherein
an output terminal of an operational amplifier is connected to the other terminal of said analog switching means, the source of said MOS field-effect transistor is connected to an inverting input terminal of said operational amplifier, and an external input is applied to a noninverting input terminal of said operational amplifier and is converted into a source follower output of said MOS field-effect transistor, which output is held.

4. A temperature-compensated analog voltage memory device as set forth in claim 3 wherein
said analog switching means consists of a reed relay.

5. A temperature-compensated analog voltage memory device as set forth in claim 3 wherein
said analog switching means consists of a second field-effect transistor, and
a negative terminal of said operational amplifier is connected through a zener diode to said negative power supply.

6. A temperature-compensated analog voltage memory device as set forth in claim 1 wherein
said constant voltage means consists of a voltage divider consisting of a first and second resistors connected in series.

7. A temperature-compensated analog voltage memory device as set forth in claim 3 wherein
said constant voltage means consists of a voltage divider consisting of a first and second resistors connected in series.

8. A temperature-compensated analog voltage memory device as set forth in claim 5 wherein
said constant voltage means consists of a voltage divider consisting of a first and second resistors connected in series.

* * * * *

UNITED STATES PATENT OFFICE
CERTIFICATE OF CORRECTION

Patent No. 4,094,007            Dated June 6, 1978

Inventor(s) Shunji Minami

It is certified that error appears in the above-identified patent and that said Letters Patent are hereby corrected as shown below:

Column 2, line 11:    "ther" should be --other--.

line 65:    "($R_2$" should be --$R_2$--.

Column 3, line 47:    "Vi < Vo" should be --Vi > Vo--.

Column 4, line 42:    "ompensated" should be --compensated--.

line 43:    "an non-" should be --a non- --.

line 50:    "instrument" should be --instruments--.

Column 6, lines 12, 17 & 22:    Change "resistors" to --resistor--.

Signed and Sealed this

Sixteenth Day of January 1979

[SEAL]

Attest:

RUTH C. MASON
*Attesting Officer*

DONALD W. BANNER
*Commissioner of Patents and Trademarks*